United States Patent
Gao et al.

(10) Patent No.: US 9,437,524 B2
(45) Date of Patent: Sep. 6, 2016

(54) THROUGH-SILICON VIA WITH SIDEWALL AIR GAP

(71) Applicant: GLOBALFOUNDRIES Inc., Grand Cayman (KY)

(72) Inventors: Shan Gao, Maita, NY (US); Seung Man Choi, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 77 days.

(21) Appl. No.: 14/514,425

(22) Filed: Oct. 15, 2014

(65) Prior Publication Data

US 2015/0054139 A1     Feb. 26, 2015

Related U.S. Application Data

(62) Division of application No. 13/853,178, filed on Mar. 29, 2013, now Pat. No. 8,877,559.

(60) Provisional application No. 61/794,194, filed on Mar. 15, 2013.

(51) Int. Cl.
*H01L 23/48* (2006.01)
*H01L 21/768* (2006.01)

(52) U.S. Cl.
CPC ....... *H01L 23/481* (2013.01); *H01L 21/76898* (2013.01); *H01L 21/7682* (2013.01); *H01L 2224/11* (2013.01); *H01L 2924/0002* (2013.01)

(58) Field of Classification Search
CPC ...................................... H01L 23/481
See application file for complete search history.

(56) References Cited

U.S. PATENT DOCUMENTS

| | | | |
|---|---|---|---|
| 7,910,473 B2 * | 3/2011 | Chen | H01L 21/6835 257/E21.573 |
| 2013/0168852 A1 | 7/2013 | Liang et al. | |
| 2015/0228541 A1 * | 8/2015 | Liu | H01L 21/76898 438/107 |

OTHER PUBLICATIONS

Long Pham, USPTO Notice of Allowance and Fee(s) Due, U.S. Appl. No. 13/853,178, Date Mailed Jul. 8, 2014, 8 pages.

* cited by examiner

*Primary Examiner* — Long Pham
(74) *Attorney, Agent, or Firm* — Williams Morgan, P.C.

(57) ABSTRACT

Embodiments of the present invention provide a novel process integration for air gap formation at the sidewalls for a Through Silicon Via (TSV) structure. The sidewall air gap formation scheme for the TSV structure of disclosed embodiments reduces parasitic capacitance and depletion regions in between the substrate silicon and TSV conductor, and serves to also reduce mechanical stress in silicon substrate surrounding the TSV conductor.

11 Claims, 7 Drawing Sheets

THROUGH-SILICON VIA WITH SIDEWALL AIR GAP

RELATED U.S. APPLICATION DATA

This application is a divisional of, and claims the benefit of, co-pending and co-owned U.S. patent application Ser. No. 13/853,178, filed Mar. 29, 2013. This application claims priority to U.S. Provisional Patent Application Ser. No. 61/794,194 filed on Mar. 15, 2013, the entire contents of which are incorporated herein by reference.

FIELD OF THE INVENTION

The present invention relates generally to semiconductor fabrication, and more particularly, to formation of through-silicon vias.

BACKGROUND

Generally, through-silicon vias (TSVs) are formed in a semiconductor wafer by initially forming an opening at least partially through a substrate. A barrier layer is formed to line the opening in order to prevent a later-formed conductive material (e.g., copper) from diffusing into the substrate, where it might deteriorate the overall performance of other devices formed on the semiconductor wafer. As such, this barrier layer prevents damage caused by the conductive material.

TSV technology is important in creating 3D packages and 3D integrated circuits (IC). It provides interconnection of vertically aligned electronic devices through internal wiring that significantly reduces complexity and overall dimensions of a multi-chip electronic circuit.

A typical TSV process includes formation of TSV holes and deposition of a diffusion barrier layer and a conductive seed layer. A conductive material is then electroplated (deposited) into TSV holes. Copper is typically used as the conductive material as it supports high current densities experienced at complex integration, such as 3D packages and 3D integrated circuits, and increased device speed. Furthermore, copper has good thermal conductivity and is available in a highly pure state. As the trend towards more complexity and higher performance of electronics continues, it is therefore desirable to have improvements in the fabrication of TSVs.

A first aspect of the present invention includes method of forming a semiconductor structure, comprising: depositing a dielectric layer on a bulk silicon substrate; forming an opening in the dielectric layer; depositing a silicon nitride layer on the dielectric layer; forming a through-silicon via cavity; applying a sacrificial layer to sidewalls of the through-silicon via cavity; depositing a conductor in the through-silicon via cavity to form a through-silicon via; performing a backside thinning process to expose the sacrificial layer; removing the sacrificial layer; and applying a sealant dielectric layer.

A second aspect of the present invention includes a method of forming a semiconductor structure, comprising: depositing a silicon oxide layer on a bulk silicon substrate; forming an opening in the silicon oxide layer; depositing a silicon nitride layer on the silicon oxide layer; forming a through-silicon via cavity; applying a sacrificial layer to sidewalls of the through-silicon via cavity; applying a barrier layer on the sacrificial layer; depositing copper in the through-silicon via cavity to form a through-silicon via; performing a backside thinning process to expose the sacrificial layer; removing the sacrificial layer with a hydrofluoric acid etchant; applying a sealant dielectric layer; and terminating the through-silicon via.

A third aspect of the present invention includes A semiconductor structure comprising: a bulk silicon substrate; a through-silicon via formed in the bulk silicon substrate; a barrier layer disposed adjacent to the through-silicon via; and an air gap disposed adjacent to the barrier layer.

SUMMARY

Embodiments of the present invention provide a novel process integration for air gap formation at the sidewalls for a Through Silicon Via (TSV) structure. The sidewall air gap formation scheme for the TSV structure of disclosed embodiments reduces parasitic capacitance and depletion regions in between the substrate silicon and TSV conductor, and serves to also reduce mechanical stress in the silicon substrate surrounding the TSV conductor.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
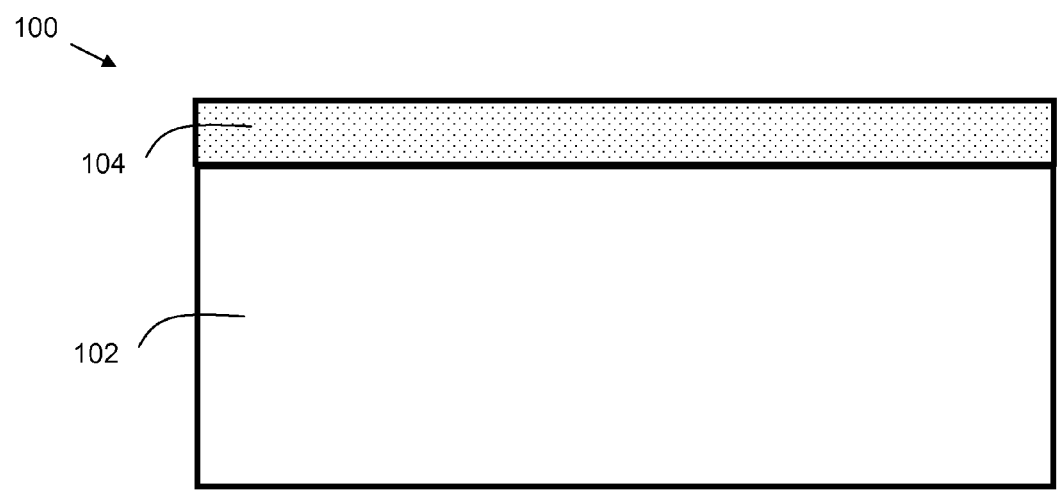
FIG. 1 is a semiconductor structure at a starting point for embodiments of the present invention.

FIG. 1 is a semiconductor structure 100 at a starting point for embodiments of the present invention. A bulk semiconductor substrate (wafer) 102 has a dielectric layer 104 disposed thereon. The dielectric layer 104 may comprise an oxide layer, such as silicon oxide.

Figure 2:
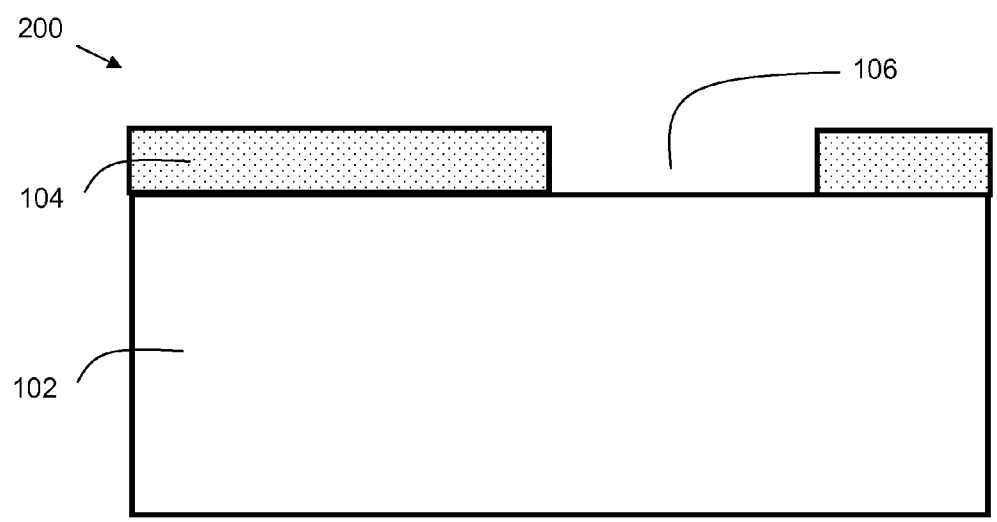
FIG. 2 is a semiconductor structure after a subsequent process step of opening the dielectric layer.

FIG. 2 is a semiconductor structure 200 after a subsequent process step forming an opening 106 in the dielectric layer. This may be performed using industry-standard patterning methods such as mask layers.

Figure 3:
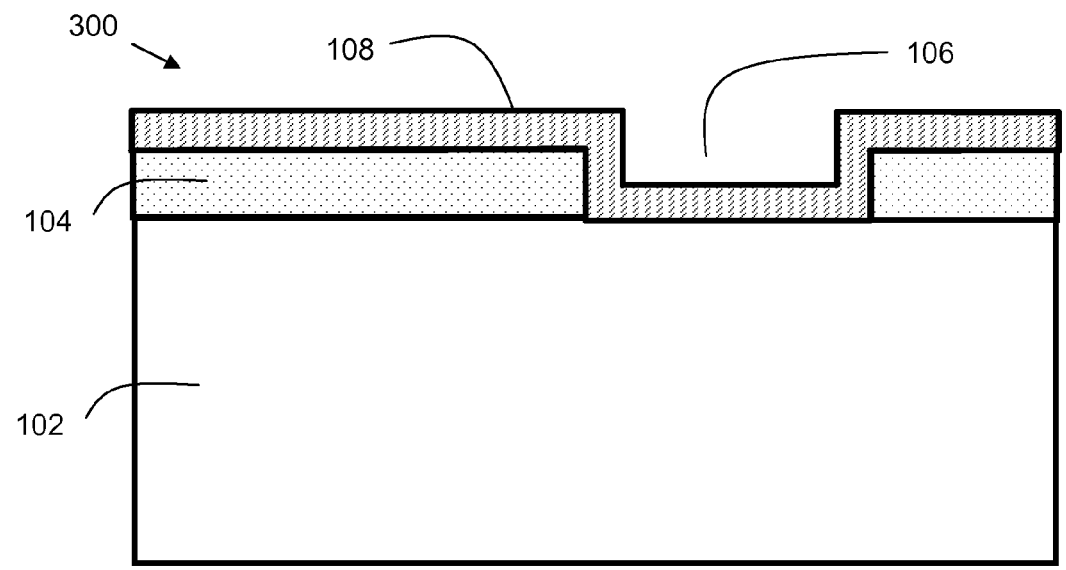
FIG. 3 is a semiconductor structure after a subsequent process step of depositing a silicon nitride layer.

FIG. 3 is a semiconductor structure 300 after a subsequent process step of depositing a silicon nitride layer 108. The silicon nitride layer may be deposited via chemical vapor deposition or other suitable process.

Figure 4:
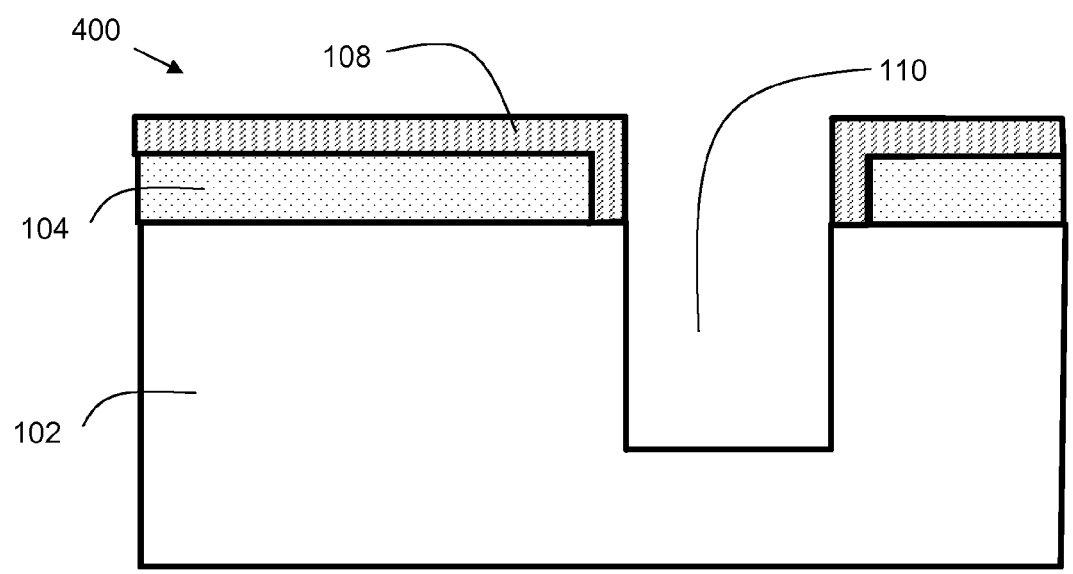
FIG. 4 is a semiconductor structure after a subsequent process step of forming a TSV cavity.

FIG. 4 is a semiconductor structure 400 after a subsequent process step of forming a TSV cavity 110. The TSV cavity may be formed using a deep reactive ion etch (DRIE) process.

Figure 5:
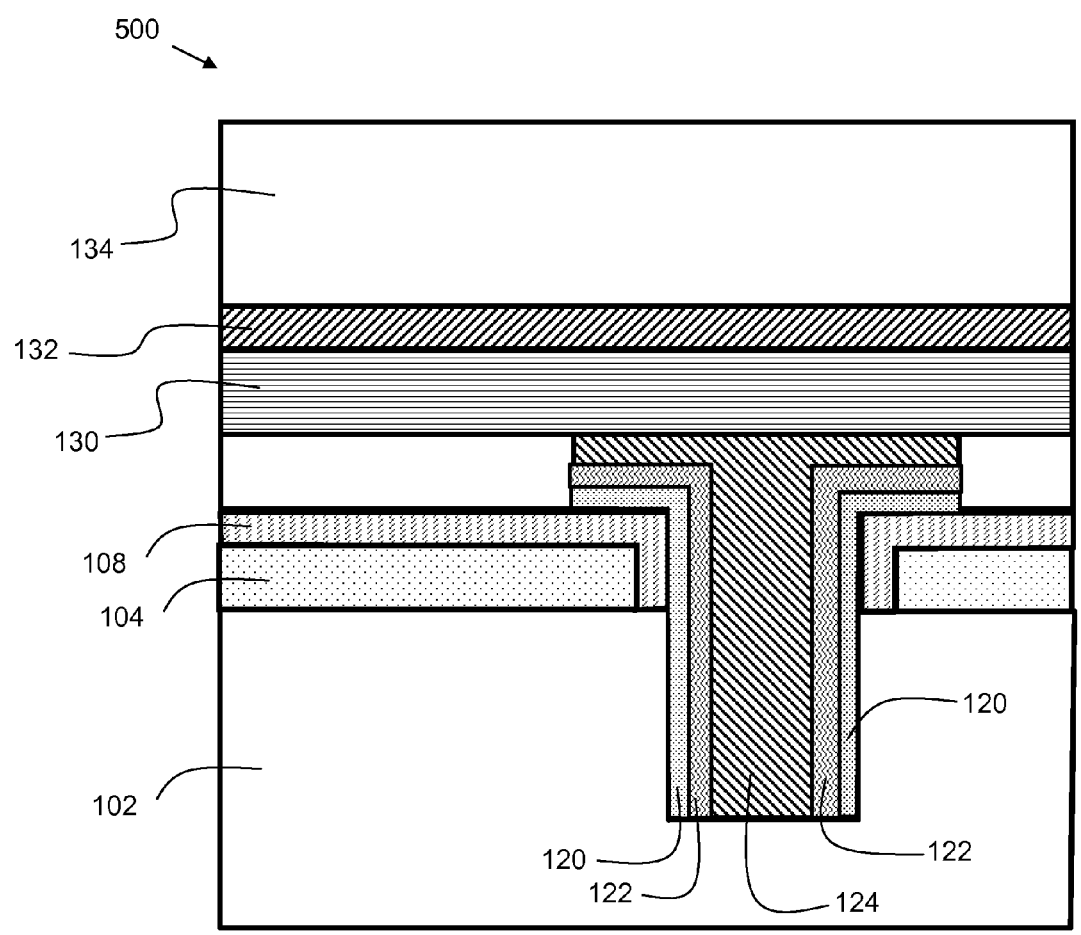
FIG. 5 is a semiconductor structure after subsequent process steps of filling the TSV cavity and applying a carrier wafer.

FIG. 5 is a semiconductor structure 500 after subsequent process steps of filling the TSV cavity and applying a carrier wafer. A sacrificial layer 120 is formed on the TSV cavity sidewalls. The sacrificial layer 120 may comprise an oxide layer, such as silicon oxide. A barrier metal 122 is deposited on the sacrificial layer 120. In some embodiments, the barrier metal 122 may comprise tantalum or titanium. In some embodiments, the barrier metal 122 is deposited via atomic layer deposition (ALD). A conductor 124 is then deposited to fill the TSV cavity. In embodiments, the conductor 124 may comprise copper or tungsten.

Next, Back-End-of-Line (BEOL) region 130 is formed, which may comprise multiple metallization, via, and interlayer dielectric layers (not shown). An adhesive layer 132 affixes a carrier substrate 134 to the semiconductor structure 500.

Figure 6:
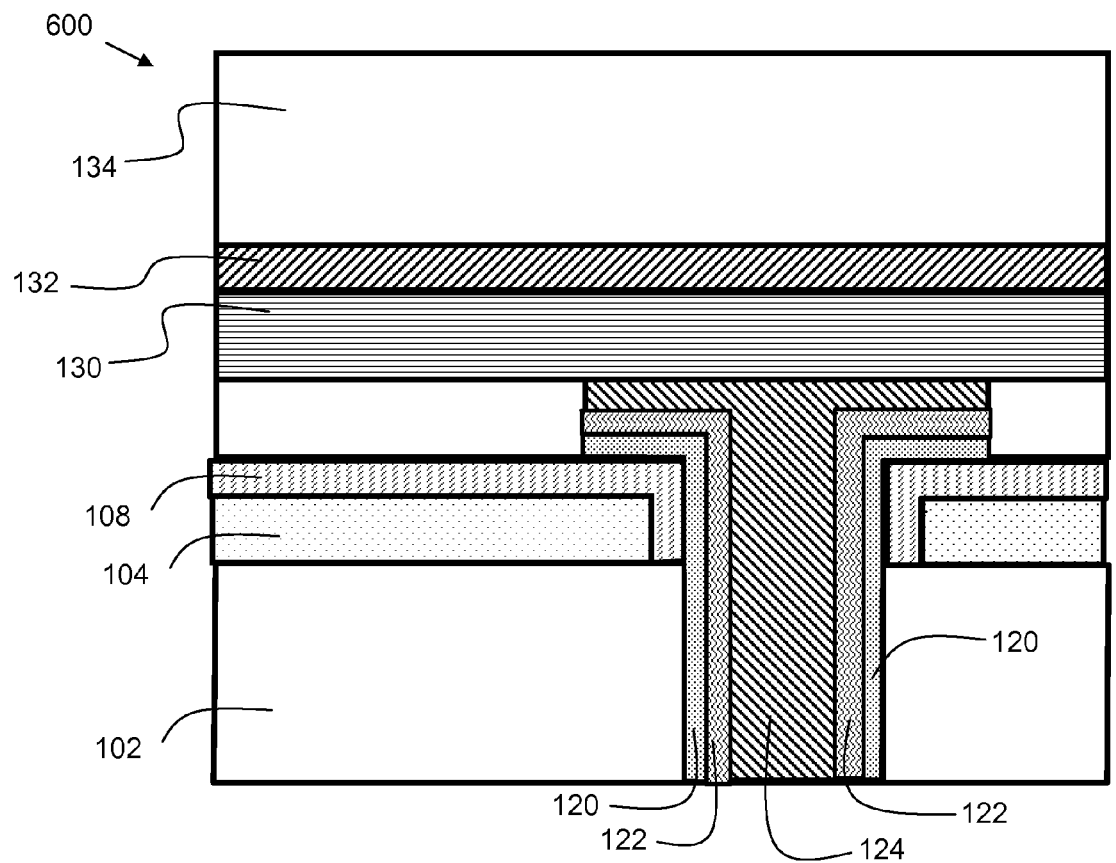
FIG. 6 is a semiconductor structure after a subsequent process step of backside thinning.

FIG. 6 is a semiconductor structure 600 after a subsequent process step of backside thinning. In embodiments, the backside thinning may be performed by etching, chemical mechanical polish (CMP) or a combination of etching and CMP. As a result of the backside thinning, the bottom of the TSV, including sacrificial layer 120, is exposed.

Figure 7:
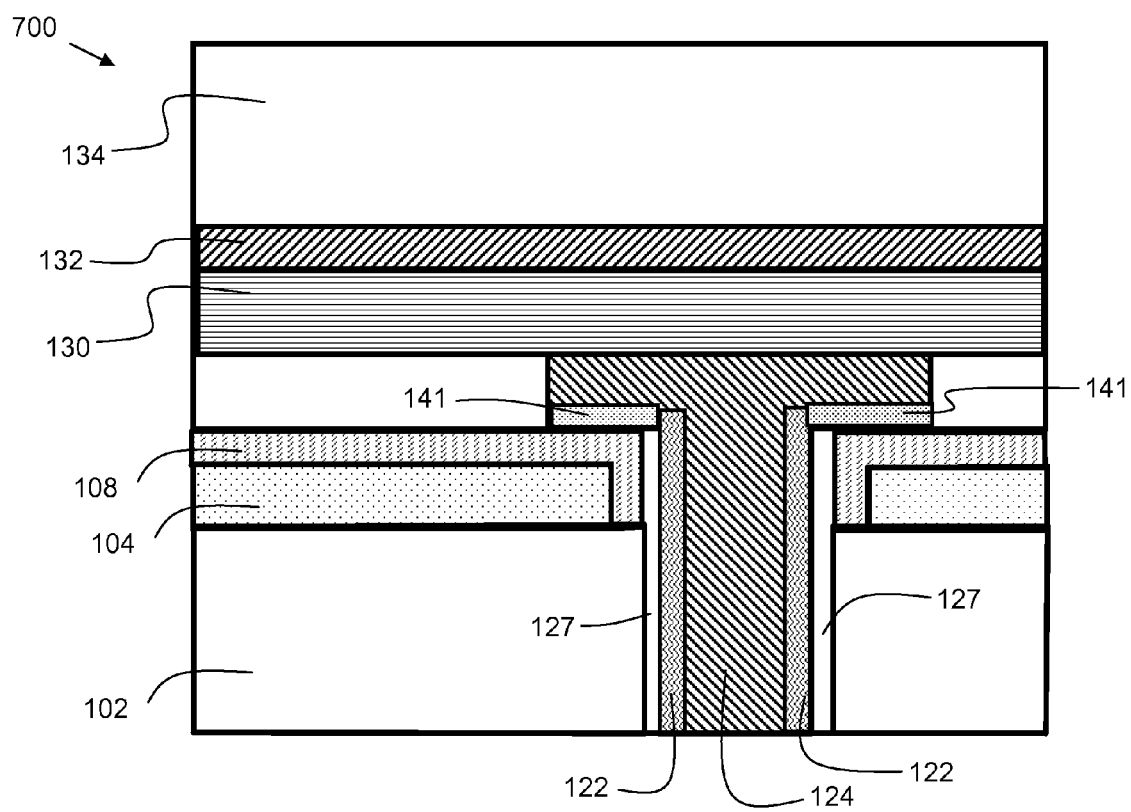
FIG. 7 is a semiconductor structure after a subsequent process step of air gap formation.

FIG. 7 is a semiconductor structure 700 after a subsequent process step of formation of air gaps 127 which are disposed adjacent to the barrier layer of the through-silicon via. A selective etch process removes a portion of sacrificial layer 120. In some embodiments, the etch process comprises a wet etch. In some embodiments, a hydrofluoric acid (HF) etchant may be used. A portion of the sacrificial layer (indicated as 141) may remain after the etch process.

Figure 8:
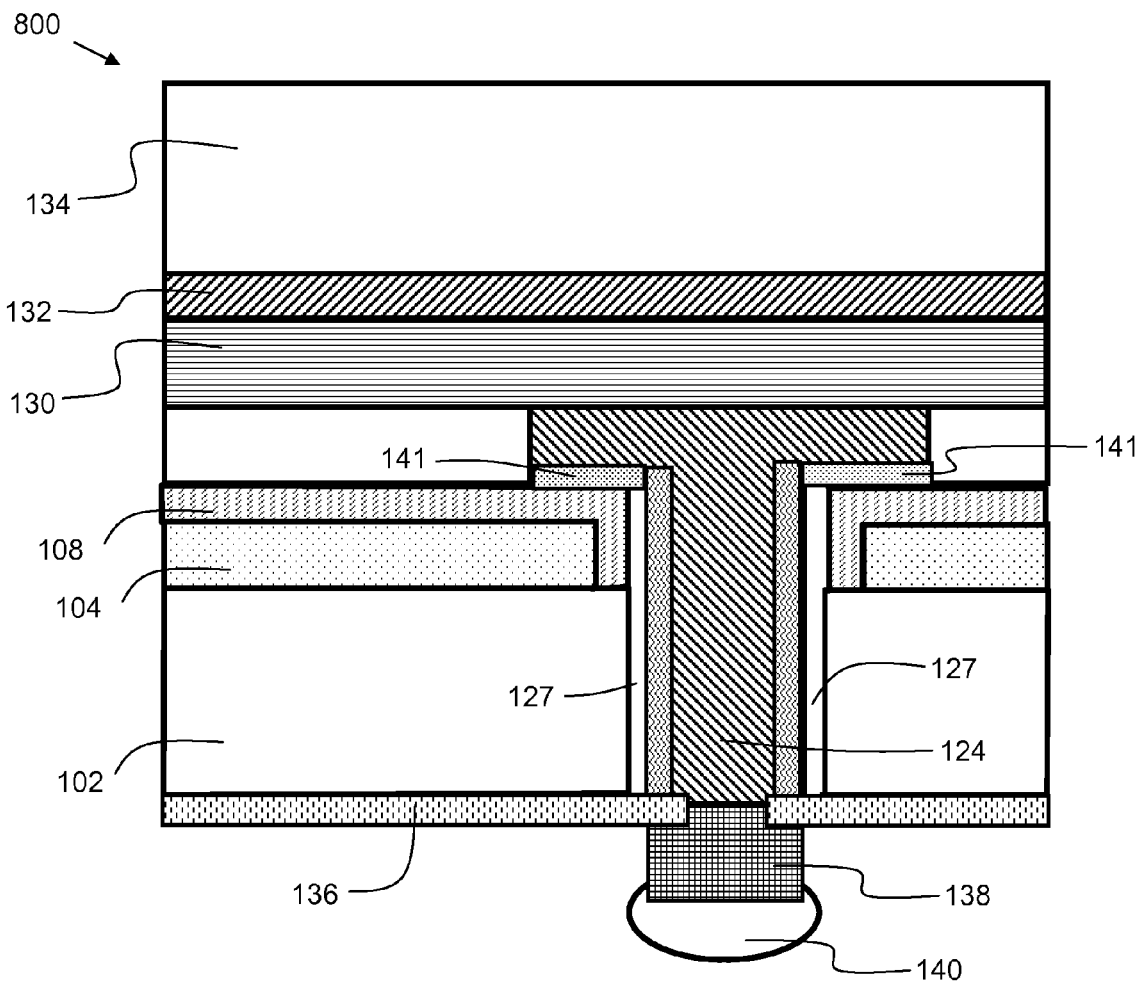
FIG. 8 is a semiconductor structure after subsequent process steps of applying a sealant dielectric layer and TSV termination.

FIG. 8 is a semiconductor structure 800 after subsequent process steps of applying a sealant dielectric layer 136 and TSV termination. The sealant dielectric layer 136 seals the air gap 127, and may comprise an organic dielectric layer. In some embodiments, the organic dielectric layer may comprise epoxy, polyimide (PI), benzocyclobutene (BCB), polybenzoxazole (PBO), or the like. In embodiments, the sealant dielectric layer is deposited via a spin coating or lamination process. To terminate the TSV, a conductor region 138 may then be deposited to be in direct physical contact with the TSV conductor 124. A solder ball 140, such as a C4 solder ball may then be attached to the conductor region 138 to serve as an input/output (I/O) connection to the semiconductor structure 800.

Figure 9:
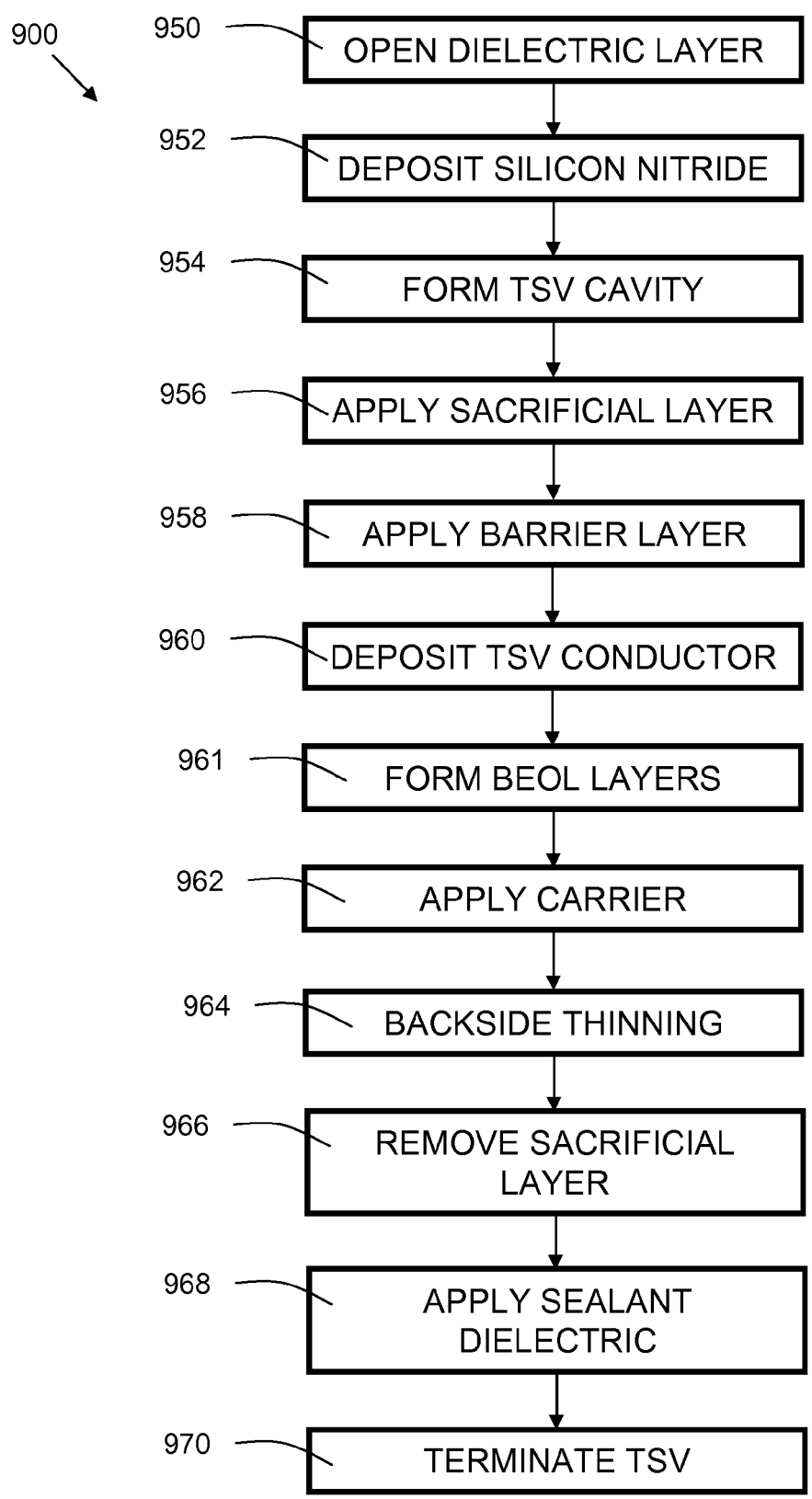
FIG. 9 is a flowchart indicating process steps for embodiments of the present invention.

FIG. 9 is a flowchart 900 indicating process steps for embodiments of the present invention. In process step 950, a dielectric layer is opened where the TSV is to be formed. In process step 952, a silicon nitride layer is deposited. In process step 954, a TSV cavity is formed. In process step 956, a sacrificial layer is deposited in the TSV cavity. The sacrificial layer may comprise an oxide, such as silicon oxide. In process step 958, a barrier layer is deposited, such as tantalum or titanium. In process step 960, a TSV conductor is deposited, such as copper or tungsten. In process step 961, the BEOL layers (including metallization, vias, and interlayer dielectrics) are formed. In process step 962, the carrier wafer is applied via an adhesive. In process step 964, backside thinning is performed to expose the sacrificial layer. This may be performed with a combination of etching and CMP processes. In process step 966, the sacrificial layer is removed to form the air gaps. The sacrificial layer may be removed via a wet etch process, such as a HF etch. In process step 968, the sealant dielectric is applied. The sealant dielectric may comprise an organic dielectric layer, and may comprise epoxy, polyimide (PI), benzocyclobutene (BCB), polybenzoxazole (PBO), or the like. In process step 970, the TSV is terminated, which may comprise one or more additional conductive regions, followed by a solder ball, such as a C4 solder ball.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
a bulk silicon substrate;

a through-silicon via formed in the bulk silicon substrate;

a barrier layer disposed adjacent to the through-silicon via;

an air gap disposed adjacent to the barrier layer;

a sealant dielectric layer disposed below the air gap, wherein the sealant dielectric layer seals the air gap; and a conductor region disposed within the sealant dielectric layer.

2. The semiconductor structure of claim 1, wherein the air gap is sealed with a sealant dielectric layer selected from the group consisting of: polyimide, benzocyclobutene, and polybenzoxazole.

3. The semiconductor structure of claim 1, wherein the barrier layer comprises tantalum.

4. The semiconductor structure of claim 1, further comprising a silicon oxide region disposed above the air gap.

5. The semiconductor structure of claim 1, wherein the through-silicon via is comprised of copper.

6. The semiconductor structure of claim 1, wherein the through-silicon via is comprised of tungsten.

7. The semiconductor structure of claim 1, wherein the sealant dielectric layer comprises epoxy.

8. The semiconductor structure of claim 1, wherein the sealant dielectric layer comprises polyimide (PI).

9. The semiconductor structure of claim 1, wherein the sealant dielectric layer comprises benzocyclobutene (BCB).

10. The semiconductor structure of claim 1 wherein the sealant dielectric layer comprises polybenzoxazole (PBO).

11. The semiconductor structure of claim 1, further comprising a solder ball attached to the conductor region.

\* \* \* \* \*